(12) United States Patent
Mouli

(10) Patent No.: US 7,688,378 B2
(45) Date of Patent: Mar. 30, 2010

(54) IMAGER METHOD AND APPARATUS EMPLOYING PHOTONIC CRYSTALS

(75) Inventor: Chandra Mouli, Boise, ID (US)

(73) Assignee: Micron Technology Inc., Boise, ID (US)

( * ) Notice: Subject to any disclaimer, the term of this patent is extended or adjusted under 35 U.S.C. 154(b) by 1007 days.

(21) Appl. No.: 11/146,090

(22) Filed: Jun. 7, 2005

(65) Prior Publication Data

US 2006/0274189 A1  Dec. 7, 2006

(51) Int. Cl.
*H04N 5/225* (2006.01)

(52) U.S. Cl. .................. 348/342; 348/336; 359/230

(58) Field of Classification Search .......... 348/340, 348/362, 207.99, 296; 359/278, 230; 428/457; 438/52; 257/680
See application file for complete search history.

(56) References Cited

U.S. PATENT DOCUMENTS

| | | | |
|---|---|---|---|
| 5,999,308 A | 12/1999 | Nelson et al. | |
| 6,069,353 A | 5/2000 | Jung et al. | |
| 6,093,246 A | 7/2000 | Lin et al. | |
| 6,388,709 B1 * | 5/2002 | Kobayashi et al. | 348/362 |
| 6,661,084 B1 * | 12/2003 | Peterson et al. | 257/680 |
| 6,667,826 B1 * | 12/2003 | Hartley et al. | 359/278 |
| 6,768,256 B1 | 7/2004 | Fleming et al. | |
| 6,856,737 B1 | 2/2005 | Parker et al. | |
| 6,958,777 B1 * | 10/2005 | Pine | 348/362 |
| 7,511,750 B2 * | 3/2009 | Murakami | 348/294 |
| 2001/0024310 A1 * | 9/2001 | Lee | 359/230 |
| 2002/0119332 A1 * | 8/2002 | Singh et al. | 428/457 |
| 2003/0030737 A1 * | 2/2003 | Yanai | 348/296 |
| 2003/0036215 A1 * | 2/2003 | Reid | 438/52 |
| 2003/0063204 A1 * | 4/2003 | Suda | 348/272 |
| 2003/0071271 A1 | 4/2003 | Suzuki et al. | |
| 2004/0022474 A1 * | 2/2004 | Lim et al. | 385/4 |
| 2004/0055528 A1 | 3/2004 | Miyazaki | |
| 2004/0080726 A1 * | 4/2004 | Suh et al. | 353/122 |

(Continued)

FOREIGN PATENT DOCUMENTS

WO    WO 03/083533 A2    10/2003

(Continued)

OTHER PUBLICATIONS

Pierce et al., "Dielectric Properties of Thin Insulating Films of Photoresist Material", IEEE Transactions on Component Parts, Mar. 1965.*

(Continued)

*Primary Examiner*—Lin Ye
*Assistant Examiner*—Dennis Hogue
(74) *Attorney, Agent, or Firm*—Dickstein Shapiro LLP

(57) ABSTRACT

An image sensor and a method of forming an image sensor. The image sensor includes an array of pixel cells at a surface of a substrate. Each pixel cell has a photo-conversion device. At least one a micro-electro-mechanical system (MEMS) element including a photonic crystal structure is provided over at least one of the pixel cells. The MEMS-based photonic crystal element is supported by a support structure and configured to selectively permit electromagnetic wavelengths to reach the photo-conversion device upon application of a voltage. As such, the MEMS-based photonic crystal element of the invention can replace or compliment conventional filters, e.g., color filter arrays.

15 Claims, 10 Drawing Sheets

U.S. PATENT DOCUMENTS

| | | |
|---|---|---|
| 2004/0160659 A1 | 8/2004 | DiCarlo |
| 2005/0128592 A1 | 6/2005 | Nishii et al. |
| 2006/0050394 A1 | 3/2006 | Suh et al. |
| 2006/0125948 A1* | 6/2006 | Orita et al. .................. 348/340 |
| 2007/0058055 A1* | 3/2007 | Yamaguchi et al. ......... 348/272 |

FOREIGN PATENT DOCUMENTS

WO     WO 03/083533 AS     10/2003

OTHER PUBLICATIONS

"Dielectric Constant Reference Guide", Clipper Controls, webpage from http://www.clippercontrols.com/info/dielectric_constants.html, dated to Jun. 22, 2003 via The Wayback Machine at archive.org.*

"Material: Aluminum Oxide", MIT, webpage from http://www.mit.edu/~6.777/matprops/alox.htm, dated to May 19, 2004 via The Wayback Machine at archive.org.*

Suh et al., Displacement Sensitive Photonic Crystal Structures Based on Guided Resonance in Photonic Crystal Slabs, Applied Physics Letters, vol. 82, No. 13, May 31, 2003.*

Fan, "Analysis of Guided Resonances in Photonic Crystal Slabs," Physical Review B, vol. 65, 2002.*

Johnson, S. et al., "Guided Modes in Photonic Crystal Slabs", Physical Review, B. Condensed Matter, American Institute of Physics, New York, US, vol. 60, No. 8, Aug. 15, 1999, pp. 5751-5758.

Biswas, R. et al.—"Photonic band gaps of porous solids," American Physical Society, Physical Review B, vol. 61, No. 7, Feb. 15, 2000, pp. 4549-4553.

Cryan, M.J. et al. —"Design and Simulation of a Photonic Crystal Waveguide Filter Using the FDTD Method," IEEE, 2002 pp. 669-670.

Douglass, M. R.—"DMD reliability: a MEMS success story," Society of Photo-Optical Instrumentation Engineers, Proceedings of SPIE, vol. 4980 (2003), pp. 1-11.

Fan, Shanhui et al.—"Analysis of guided resonances in photonic crystal slabs," American Physical Society, Physical Review B, vol. 65 (2002), pp. 235112-1 thru 235112-8.

Han, H. et al.—"Terahertz pulse propagation in a plastic photonic crystal fiber," American Institute of Physics, Applied Physics Letters, vol. 80, No. 15, Apr. 15, 2002, pp. 2634-2636.

Parimi, Pantanjali V. et al.—"Imaging by a Flat Lens due to Negative Refraction," Nature Publishing Group, vol. 426, Nov. 27, 2003, pp. 1-4 and p. 404.

Pendry, J. B.—"Negative Refraction Makes a Perfect Lens," The American Physical Society, Physical Review Letters, vol. 85, No. 18, Oct. 30, 2000, pp. 3966-3969.

Rave, E. et al.—"Infrared photonic crystal fiber," American Institute of Physics, Applied Physics Letters, vol. 83, No. 10, Sep. 8, 2003, pp. 1912-1914.

Stevenson, A.C. et al.—"Detection of acoustic solitary waves in nonlinear lithium niobate crystals," American Institute of Physics, Applied Physics Letters, vol. 82, No. 16, Apr. 21, 2003, pp. 2733-2735.

Suh, Wonjoo et al.—"Displacement-sensitive photonic crystal structures based on guided resonance in photonic crystal slabs," Applied Physics Letters, vol. 82, No. 13, Mar. 31, 2003, pp. 1999-2001.

Johnson S. G. et al: "Guided Modes in Photonic Crystal Slabs" Physical Review, B. Condensed Matter American Inst. Of Physics. New York, U.S. vol. 60 No. 8 pp. 5751-5758, Xp002215051 ISSN: 0163-1829 abstract; figures 1, 3, 10, 14. Aug. 15, 1999.

SuH Wonjoo et al: "Displacement-sensitive photonic crystal structures based on guided resonance in photonic crystal slabs" Applied Physics Letter, AIP, American Institute of Physics, Melville, NY, US. vol. 82, No. 13. Mar. 13, 2003 pp. 1999-1001, Xp012033616 ISSN: 0003-6951.

* cited by examiner

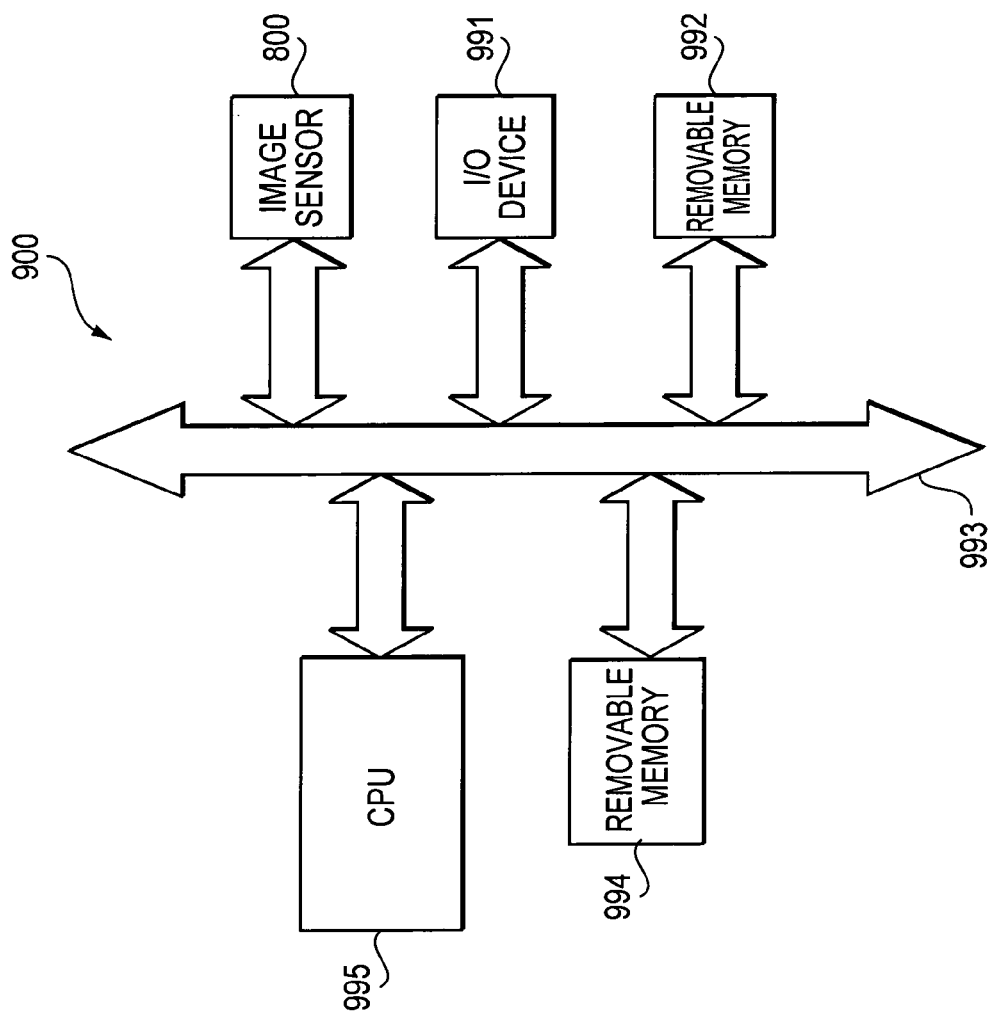

IMAGER METHOD AND APPARATUS EMPLOYING PHOTONIC CRYSTALS

FIELD OF THE INVENTION

The present invention relates generally to the field of semiconductor devices and more particularly to photonic crystals utilized in image sensor devices or displays.

BACKGROUND OF THE INVENTION

The semiconductor industry currently uses different types of semiconductor-based image sensors that use micro-lenses, such as charge coupled devices (CCDs), CMOS active pixel sensors (APS), photodiode arrays, charge injection devices and hybrid focal plane arrays, among others. These image sensors use the micro-lenses to focus electromagnetic radiation onto a photo-conversion device, e.g., a photodiode. Also, these image sensors can use filters to select particular wavelengths of electromagnetic radiation (associated with, e.g., a particular color) for sensing by the photo-conversion device.

Micro-lenses of an image sensor help increase optical efficiency and reduce cross talk between pixel cells. FIG. 1A shows a portion of a CMOS image sensor pixel cell array 100. The array 100 includes pixel cells 10, each being formed on a substrate 1. Each pixel cell 10 includes a photo-conversion device 12, for example, a photodiode. The illustrated array 100 has micro-lenses 20 that collect and focus light on the photo-conversion devices 12. The array 100 can also include a light shield, e.g., a metal layer 7, to block light intended for one photo-conversion device 12 from reaching photo-conversion devices 12 of the other pixel cells 10.

The array 100 can also include a color filter array 30. The color filter array includes color filters 31a, 31b, 31c, each disposed over a respective pixel cell 10. Each of the filters 31a, 31b, 31c allows only particular wavelengths of light (corresponding to a particular color) to pass through to a respective photo-conversion device. Typically, the color filter array 30 is arranged in a repeating Bayer pattern and includes two green color filters 31a, a red color filter 31b, and a blue color filter 31c, arranged as shown in FIG. 1B.

Between the color filter array 30 and the pixel cells 10 is an interlayer dielectric (ILD) region 3. The ILD region 3 typically includes multiple layers of interlayer dielectrics and conductors that are over an insulating planarization layer and which form connections between devices of the pixel cells 10 and connections from the pixel cells 10 to circuitry (not shown) peripheral to the array 100. A dielectric layer 5 is typically between the color filter array 30 and the micro-lenses 20.

Typical color filters 31a, 31b, 31c can be fabricated using a number of conventional materials and techniques. For example, color filters 31a, 31b, 31c can be a gelatin or other appropriate material dyed to the respective color. Also, polyimide filters comprising thermally stable dyes combined with polyimides have been incorporated using photolithography processes. Although color filters prepared using photolithography can exhibit good resolution and color quality, photolithography can be complicated and results in a high number of defective filters 31a, 31b, 31c. Specifically, using photolithography to form the color filter array 30 including polyimide filters 31a, 31b, 31c requires a mask, a photoresist, a baking step, an etch step, and a resist removal step for each color. Thus, to form color filter array 30 arranged in a Bayer pattern, this process must be repeated three times.

It would, therefore, be advantageous to have alternative filters for use in an image sensor to provide a greater variety of engineering and design opportunities.

BRIEF SUMMARY OF THE INVENTION

Exemplary embodiments of the invention provide an image sensor and a method of forming an image sensor. The image sensor includes an array of pixel cells at a surface of a substrate. Each pixel cell has a photo-conversion device. At least one a micro-electro-mechanical system (MEMS) element including a photonic crystal structure is provided over at least one of the pixel cells. The MEMS-based photonic crystal element is supported by a support structure and configured to selectively permit electromagnetic wavelengths to reach the photo-conversion device upon application of a voltage. As such, the MEMS-based photonic crystal element of the invention can replace or compliment conventional filters, e.g., color filter arrays.

BRIEF DESCRIPTION OF THE DRAWINGS

The foregoing and other advantages and features of the invention will become more apparent from the detailed description of exemplary embodiments provided below with reference to the accompanying drawings in which:

FIG. 9 is a block diagram of a processor system including the image sensor of FIG. 8.

DETAILED DESCRIPTION OF THE INVENTION

Figure 1A:
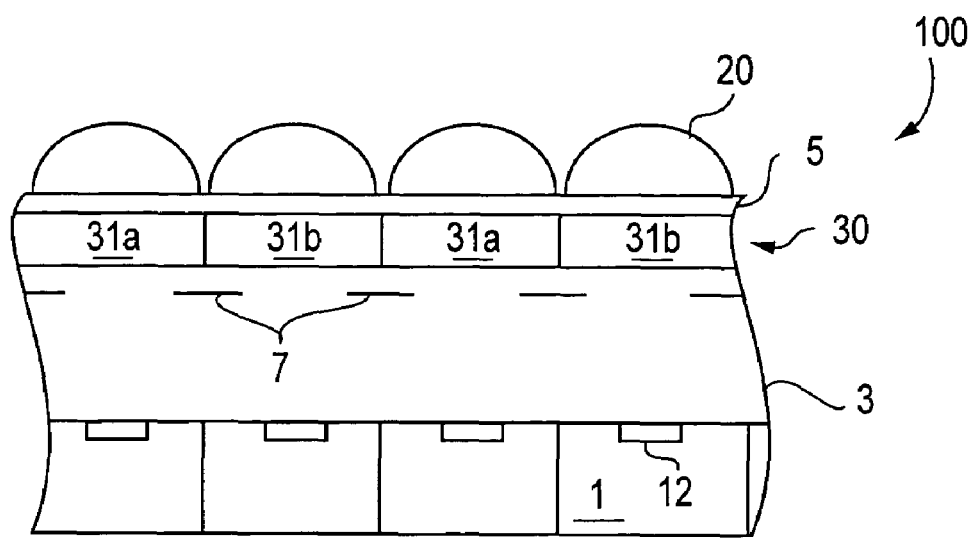
FIG. 1A is a cross-sectional view of a portion of a conventional image sensor array.

In the following detailed description, reference is made to the accompanying drawings, which form a part hereof and illustrate specific embodiments in which the invention may be practiced. In the drawings, like reference numerals describe substantially similar components throughout the several views. These embodiments are described in sufficient detail to enable those skilled in the art to practice the invention, and it is to be understood that other embodiments may be utilized, and that structural, logical and electrical changes may be made without departing from the spirit and scope of the present invention.

The terms "wafer" and "substrate" are to be understood as including silicon, silicon-on-insulator (SOI), or silicon-on-sapphire (SOS) technology, doped and undoped semiconductors, epitaxial layers of silicon supported by a base semiconductor foundation, and other semiconductor structures. Furthermore, when reference is made to a "wafer" or "substrate" in the following description, previous process steps may have been utilized to form regions or junctions in the base semiconductor structure or foundation. In addition, the semiconductor need not be silicon-based, but could be based on silicon-germanium, germanium, or gallium-arsenide.

The term "pixel" or "pixel cell" refers to a picture element unit cell containing a photo-conversion device for converting electromagnetic radiation to an electrical signal. Typically, the fabrication of all pixel cells in an image sensor will proceed concurrently in a similar fashion.

The term "photonic crystal" refers to a material and/or lattice of structures (e.g. an arrangement of pillars) with a periodic alteration in the index of refraction. A "photonic crystal element" is an element that comprises a photonic crystal structure.

Embodiments of the invention provide a micro-electromechanical system (MEMS) element having a photonic crystal structure and an image sensor employing a MEMS-based photonic crystal element. The transmission and reflectance characteristics of the elements are electronically controlled to select different electromagnetic wavelengths at different times. The MEMS-based photonic crystal element can serve a variety of purposes within an image sensor including, for example, serving as an additional filter, a replacement for conventional filters, for example, as a color filter array, or as a compliment to conventional filters.

Photonic crystals have recently been recognized for their photonic band gaps. A photonic crystal interacts with electromagnetic waves analogously to how a semiconductor crystal interacts with charge particles or their wave forms, i.e., photonic crystal structures are optical analogs of semiconductor crystal structures. The fundamental aspect of both photonic and semiconductor crystals is their periodicity. In a semiconductor, the periodic crystal structure of atoms in a lattice is one of the primary reasons for its observed properties. For example, the periodicity of the structure allows quantization of energy (E) levels and wave vector momentum (k) levels (band structure, E-k relationships). Similar to band gap energy in semiconductors, where carrier energies are forbidden, photonic crystals can provide a photonic band gap for electromagnetic waves, where the presence of particular wavelengths is forbidden. See Biswas, R. et al., *Physical Review B*, vol. 61, no. 7, pp. 4549-4553 (1999), the entirety of which is incorporated herein by reference.

Photonic crystals have structures that allow the tailoring of unique properties for electromagnetic wave propagation. Unlike semiconductors, photonic crystals are not limited to naturally occurring materials and can be synthesized easily. Therefore, photonic crystals can be made in a wide range of structures to accommodate the wide range of frequencies and wavelengths of electromagnetic radiation. Electromagnetic waves satisfy the simple relationship to the velocity of light:

$$c = n\lambda$$

where c=velocity of light in the medium of interest, n=frequency and λ=wavelength. Radio waves are in the 1 millimeter (mm) range of wavelengths whereas extreme ultraviolet rays are in the 1 nanometer (nm) range. While band structure engineering in semiconductors is very complex, photonic band structure engineering in photonic crystals it is relatively simple. Photonic crystals can be engineered to have a photonic band structure that blocks particular wavelengths of light while allowing other wavelengths to pass through.

Figure 2:
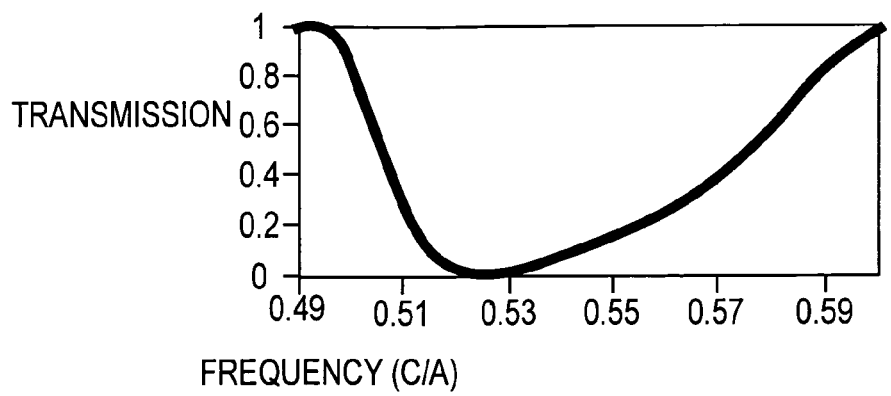
FIG. 2 is a graph illustrating the transmission spectrum through an exemplary photonic crystal.

Photonic crystals can be formed of dielectric materials, conductive materials, and conductively-coated dielectric materials. It has been shown that small displacements between two photonic crystal structures can cause changes in the transmittance and reflectance characteristics of the two structures together. See Wonjoo Suh et al., "Displacement-sensitive Photonic Crystal Structures Based on Guided Resonance in Photonic Crystal Slabs," *Applied Physics Letters*, vol. 82, No. 13, pp. 1999-2001 (Mar. 31, 2003), which is incorporated herein by reference. FIG. 2 is a graph showing an exemplary transmission spectrum through a single photonic crystal slab. As shown in FIG. 2, a property of guided resonance is the strong reflectivity signal near the fundamental wavelength. It has been shown that such guided resonance can be a wide band phenomenon. See, Shanhui Fan et al., "Analysis of Guided Resonances in Photonic Crystal Slabs," *Physical Review B*, vol. 65, pp. 235112-1 to 235112-8 (2002), which is incorporated herein by reference.

Figure 3:
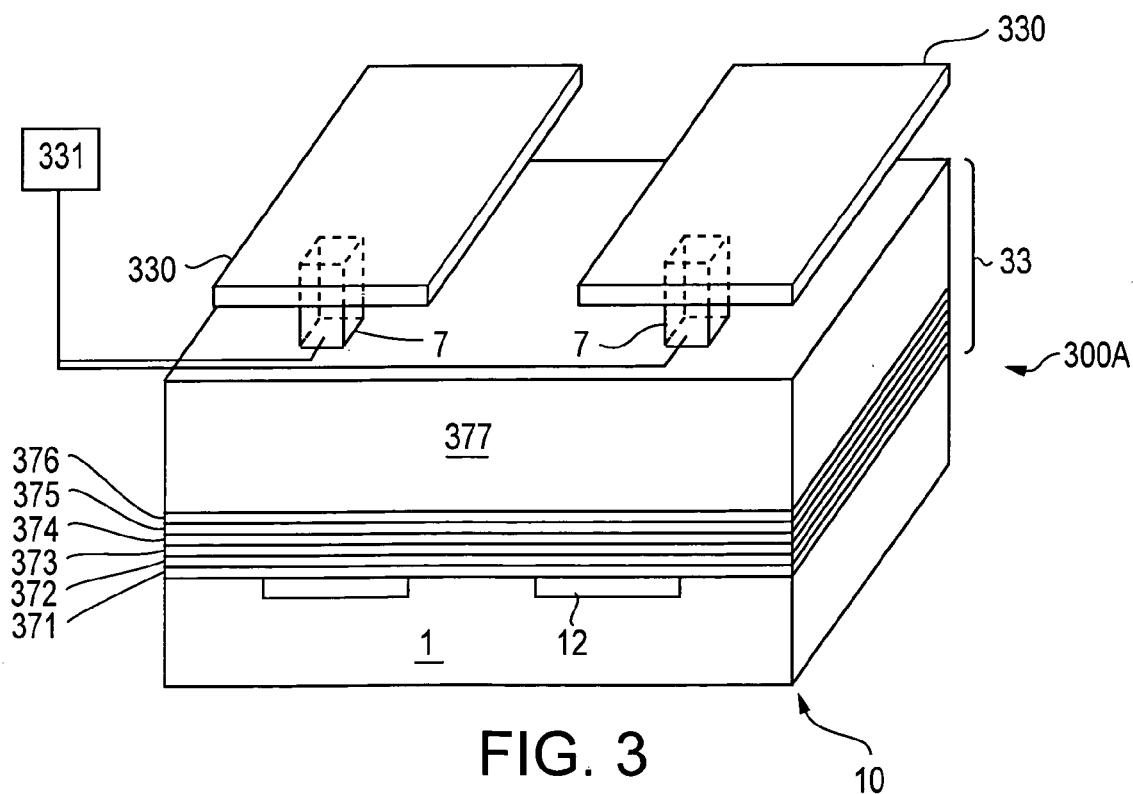
FIG. 3 is a three dimensional view of a portion of an image sensor array including MEMS-based photonic crystal elements according to an exemplary embodiment of the invention.
Figure 6:
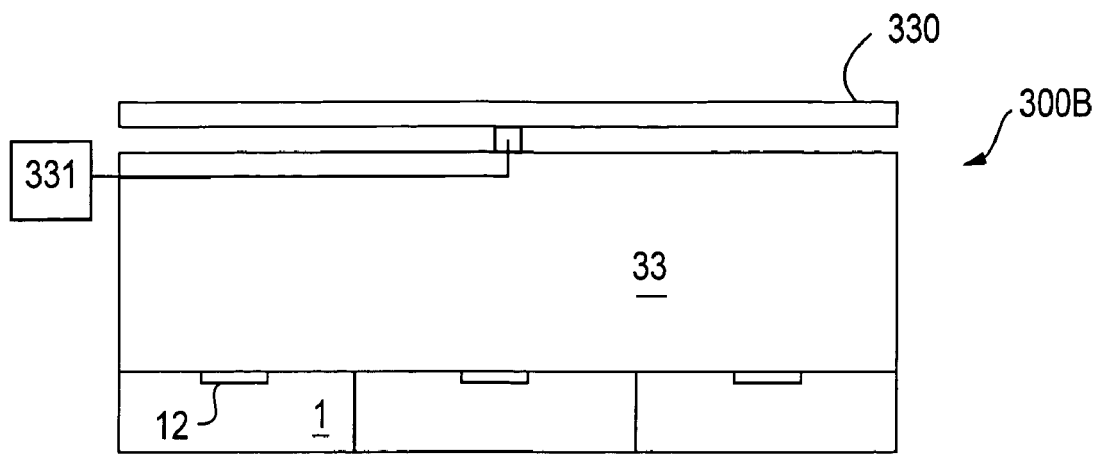
FIG. 6 is a cross-sectional view of a portion of an image sensor array including MEMS-based photonic crystal elements according to another exemplary embodiment of the invention.
Figure 7:
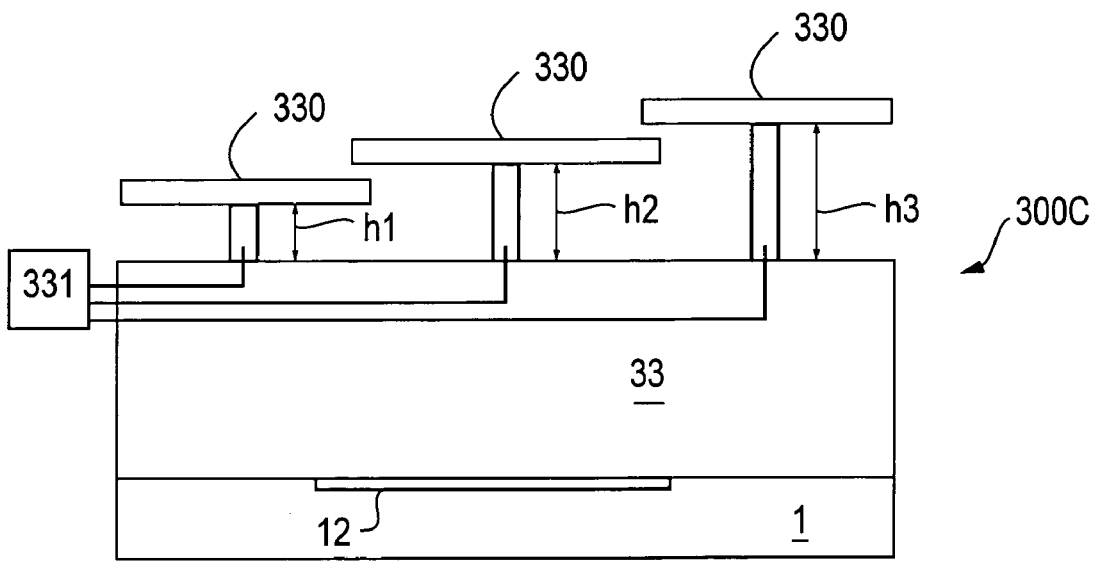
FIG. 7 is a cross-sectional view of a portion of an image sensor array including MEMS-based photonic crystal elements according to another exemplary embodiment of the invention.

FIGS. 3, 6, and 7 illustrate a portion of image sensor arrays 300A, 300B, 300C, respectively, each including one or more MEMS-based photonic crystal elements 330 according to exemplary embodiments of the invention. The photonic band structure of the elements 330 can be engineered to achieve the desired properties for the elements 330 (e.g., range of wavelength selectivity) as described in more detail below. The elements 330 are controlled by circuitry 331.

For illustrative purposes, image sensor arrays 300A, 300B, 300C are CMOS image sensor arrays including CMOS pixel cells 10. It should be readily understood that the invention may also be employed with CCD and other image sensors.

In the exemplary embodiments of FIGS. 3, 6 and 7, the arrays 300A, 300B, 300C are partially similar to the array 100 depicted in FIG. 1A in that each array 300A, 300B, 300C includes pixel cells 10 having photo-conversion devices 12. Each array 300A, 300B, 300C, however, includes one or more MEMS-based photonic crystal elements 330 over at least a portion of the pixel cells 10. The element(s) 330 include a photonic crystal structure. The photonic crystal structure of element(s) 330 can be varied to achieve desired characteristics e.g., a desired photonic band structure to prevent particular wavelengths of light from passing through the element(s) 330 and to allow particular wavelengths of light to pass through the element(s) 330 upon application of particular voltages to the element 330.

Application of a voltage to one or more of the elements 330 causes electrostatic forces to laterally and, optionally, vertically displace one of the elements 330 with respect to at least one other element 300. Such displacement causes cause changes in the transmittance and reflectance characteristics of the elements 330 together as described above. See Wonjoo Suh et al., "Displacement-sensitive Photonic Crystal Structures Based on Guided Resonance in Photonic Crystal Slabs," *Applied Physics Letters*, vol. 82, No. 13, pp. 1999-2001 (Mar. 31, 2003). Thus, the elements 330 can be operated using circuitry 331 to select particular wavelengths for transmission based upon voltage application.

The region 33 can have the exemplary structure shown in FIG. 3. A layer 371 of tetraethyl orthosilicate (TEOS) is over the substrate 1 and the devices formed thereon, including the photo-conversion devices 12 and, e.g., transistors (not shown) of the pixel cells 10. Over the TEOS layer 371, there is a layer 372 of borophosphosilicate glass (BPSG) followed by first, second, and third interlayer dielectric layers 373, 374, 375, respectively. A passivation layer 376 is over the third interlayer dielectric layer 375. Optionally, one or more filters 377 can also be included. There are also conductive structures, e.g., metal lines, forming connections between devices of the pixel cells 10 and connections from the pixel cell 10 devices to external devices (not shown) supported by the ILD layers.

FIG. 3 depicts a pixel cell array 300A including first and second elements 330, each having a photonic crystal structure. The elements 300 are supported by support structures 7. The support structures 7 enable the displacement of the elements 330 with respect to the surface of the substrate 1. Additional support structures can be employed to support and control the elements 330. For example, elements 330 can be supported and controlled in a similar manner to that employed in a digital micro-mirror device as disclosed in U.S. Pat. No. 6,870,660, which is incorporated herein by reference. The support structure 7 can be chosen to provide the desired displacement of the elements 330. For example the elements 330 can be displaced laterally, angularly, and/or vertically displaced with respect to the substrate 1. Exemplary angular displacements are between about 0 degrees to about 70 degrees.

In the embodiment of FIG. 3, elements 330 are configured to be controllable to selectively prevent all light from reaching one or more photo-conversion devices 12. Thus, light incident on one or more specific areas of the array 300A can be sampled. Alternatively, the element is configured to be controllable to select between visible light wavelengths and infrared wavelengths.

The elements 330 are controlled by control circuitry 331. Control circuitry 331 causes the application of one or more voltages to each of the elements 330. The elements 330 can be controlled to prevent all or a portion of incident light from being transmitted to the underlying photo-conversion devices 12. In particular, the elements can be controlled to allow particular wavelengths of light to be incident on the photo-conversion devices 12 at a particular time. For example, elements 330 can be controlled to allow visible light to be reach the photodiodes 12 at one time and prevent all light from reaching the photodiodes 12 at another time. Alternatively, elements 330 can be controlled to allow infrared and visible wavelengths of light to be incident on the photo-conversion devices 12 at different times. In the illustrated embodiment, each element 330 is formed on a base layer 305. The base layer 305 can be, for example $SiO_2$, BPSG or another dielectric layer, such as phosphosilicate glass (PSG) and borosilicate glass (BSG).

FIGS. 4A-4E depict steps for forming the array 300A of FIG. 3. No particular order is required for any of the actions described herein, except for those logically requiring the results of prior actions. Accordingly, while the actions below are described as being performed in a general order, the order is exemplary only and can be altered.

Figure 4A:
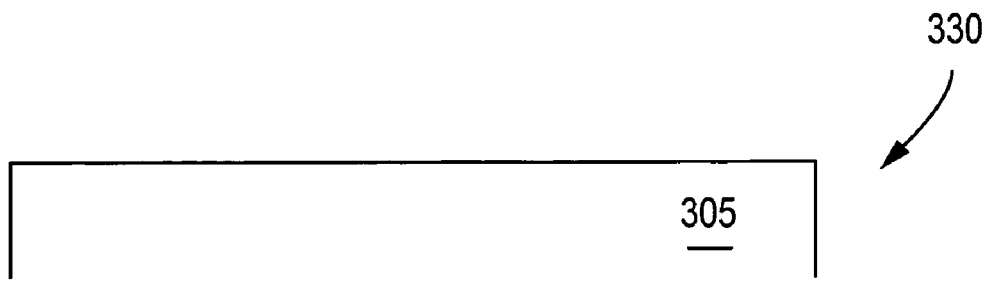
FIGS. 4A-4E illustrate intermediate stages of fabrication of the image sensor array of FIG. 3 according to another exemplary embodiment of the invention.

Referring to FIG. 4A, a base layer 305 is provided to support the elements 330. The base layer 305 can be any suitable material that provides an approximately flat surface on which the photonic crystal structure of filter 330 can be formed. For example, the base layer 305 can be a dielectric layer (e.g., a layer of $SiO_2$, or BPSG and can have a thickness within the range of approximately 50 Å to approximately 200 Å.

Figure 4B:
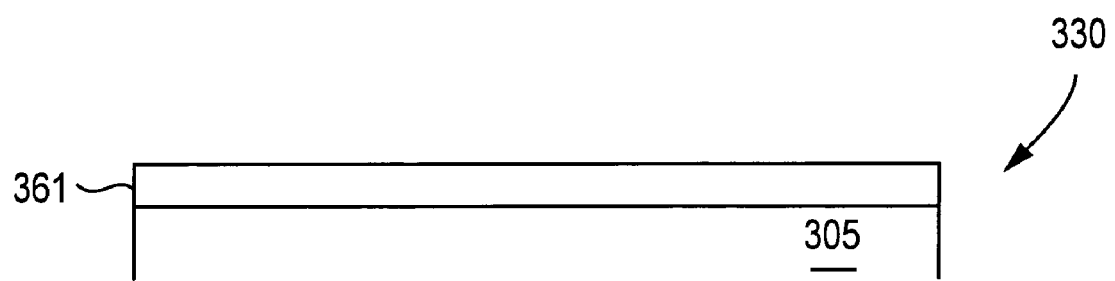

As shown in FIG. 4B, a layer 361 of material suitable for forming a photonic crystal is formed over the base layer 305. Examples of such materials include aluminum oxide ($Al_2O_3$); tantalum oxide ($Ta_2O_3$); zirconium oxide ($ZrO_2$); hafnium oxide ($HfO_2$); hafnium-based silicates; and conductive oxides, such as indium tin oxide, and zinc-tin oxide; among others. It should be noted that certain materials can yield a photonic crystal that absorbs a portion of the photons. If the absorption is excessive, quantum efficiency can be detrimentally affected. Preferably, layer 361 is a layer of $Al_2O_3$ since it offers less absorption and is similar to $SiO_2$ in its barrier properties. The thickness of layer 361 can be chosen as needed or desired. Preferably, layer 361 is formed having a thickness within the range of approximately 100 Å to approximately 5000 Å.

Figure 4C:
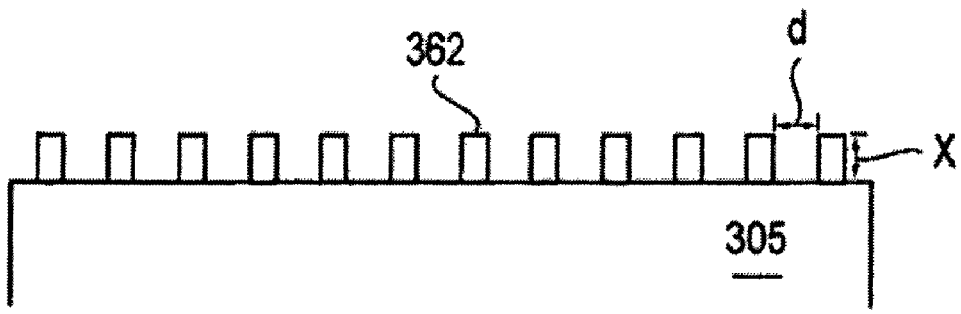

Using a mask level, the photonic crystal material layer 361 is patterned and etched to create photonic crystal structure pillars 362, as depicted in FIG. 4C. Referring to FIG. 4C, the ratio x/d of spacing x between the pillars 362 to the thickness d of layer 361 (or height of the pillars 362) can be varied to achieve desired characteristics of the photonic crystal, and thus, the filter 330. Illustratively, the ratio x/d is within the range of approximately 1 to approximately 10. If patterning the pillars 362 to achieve a desired ratio x/d is a challenge with existing mask-defined lithography techniques, the pillars can also be formed using spacer-defined lithography, such that the pillars are defined by process steps rather than a mask layer.

Figure 5A:
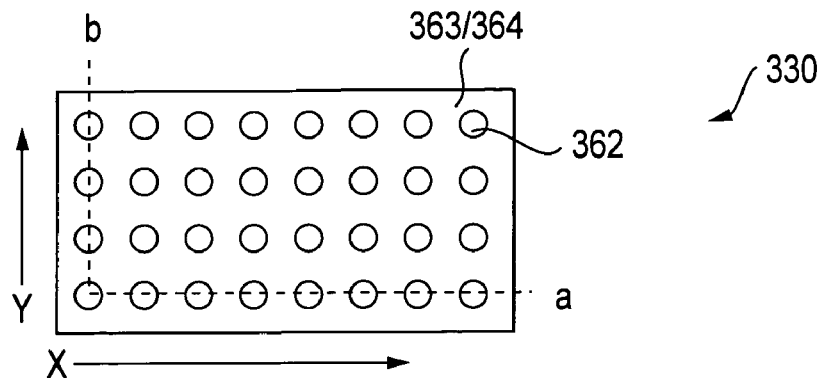
FIGS. 5A-5D are top down views of photonic crystal structures according to exemplary embodiments of the invention.
Figure 5B:
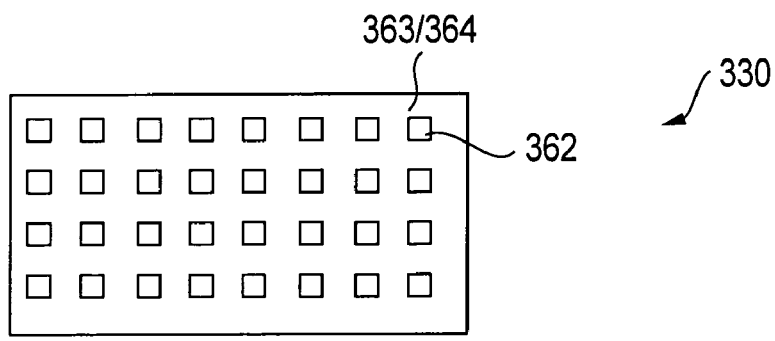
Figure 5C:
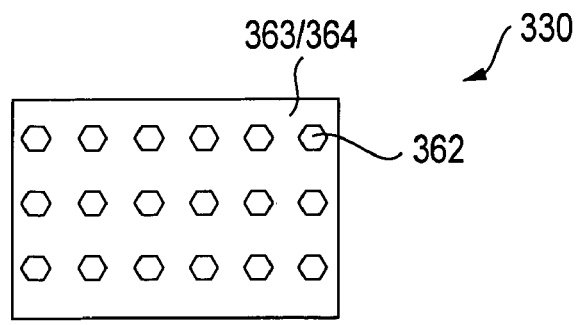

The pillars 362 can be formed having any desired horizontal cross-sectional shape. FIGS. 5A-5C depict exemplary pillar 362 shapes. FIG. 5A is a top plan view of element 330 with pillars 362 having a circular horizontal cross-sectional shape (i.e., the pillars 362 are cylinders). FIGS. 5B and 5C depict element 330 including pillars having rectangular and pentagonal horizontal cross-sectional shapes, respectively.

Figure 5D:
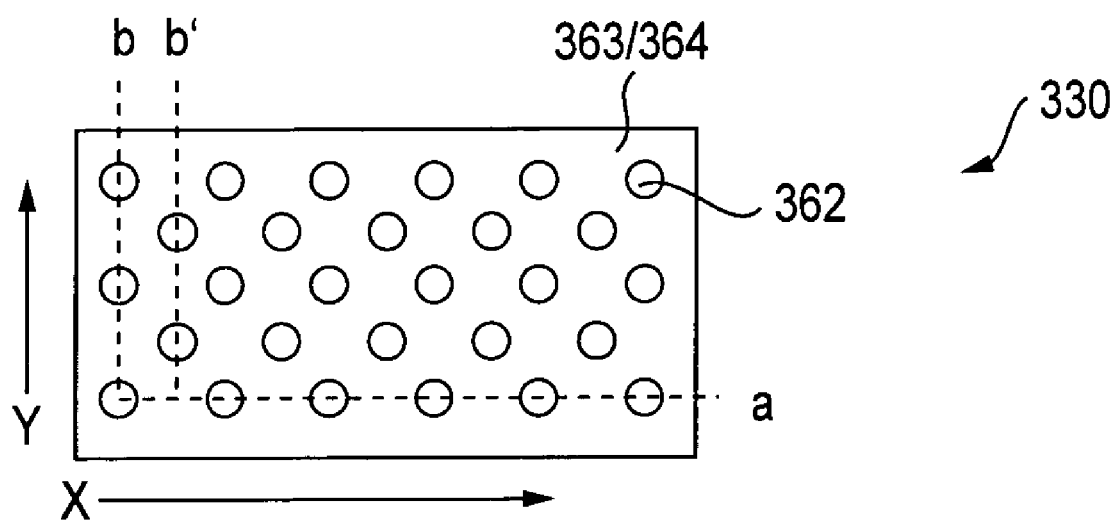

Also, the pillars 362 can be arranged in a variety of orientations. As shown in FIG. 5A, the pillars 362 are arranged in columns B in the Y direction and rows A in the X direction, such that a pillar 362 from each consecutive row A forms a column B in the Y direction. Alternatively, as shown in FIG. 5D, the pillars 362 can be arranged in rows along line A in the X direction with each row along line A being offset from an adjacent row A, such that pillars 362 from every other row A form a column B and B', respectively, in the Y direction.

Each thickness d, spacing x, x/d ratio, horizontal cross-sectional shape of the pillars 362, orientation of the pillars 362, and the material of the pillars 362 and layer 363 or 364, described below, are variables, which can be chosen to achieve a desired photonic crystal structure and, therefore, provide desired properties of elements 330.

Figure 4D:
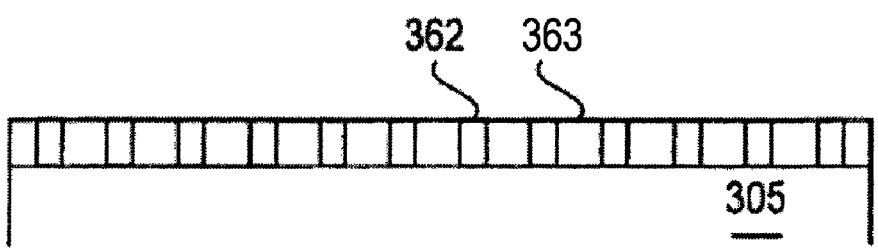

According to an exemplary embodiment of the invention, an optional low dielectric constant layer 363 is deposited between the pillars 362 and planarized using a CMP step, as illustrated in FIG. 4D. Layer 363 can be formed of any suitable material having a low dielectric constant, for example, SOG or $SiO_2$, among others. In one exemplary embodiment, the layer 363 is formed of a material having a dielectric constant lower than that of the pillars 362. The layer 363 can be formed by any suitable technique.

Figure 4E:
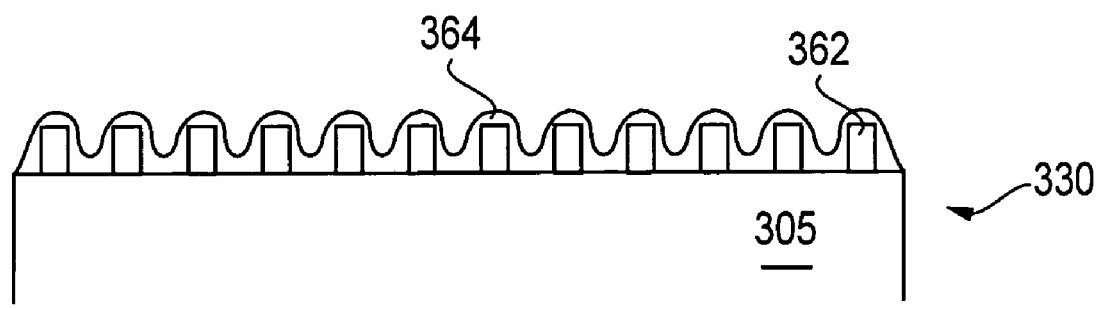

According to an alternative exemplary embodiment, as shown in FIG. 4E, the pillars 362 are coated or plated with an optional conductive film 364. In one embodiment, the conductive film 364 is a copper is a copper film. The film 364 can be formed by any suitable technique, e.g., electroplating.

In either embodiment shown in FIGS. 4D and 4E, a metal layer 365 is deposited by any suitable technique over the pillars 362. The metal layer 365 is patterned to create a first MIEMS-based photonic crystal element 330. Specifically, the metal layer 365 is patterned and etched as desired and to remove at least the portions of the metal layer 365 over the photo-conversion devices 12. The element 330 includes the pillars 362, optionally layer 363 or 364, and metal layer 365. For simplicity, however, the element 330 is shown as a single structure in FIG. 3 and FIGS. 6 and 7 (described below).

Any of the variables (thickness d of layer 361, the spacing x between the pillars 362, the ratio x/d, the horizontal cross-sectional shape of the pillars 362, the orientation of the pillars 362, and materials of pillars 362 and layer 363) can be varied to achieve a desired photonic crystal structure for each of the first, second and third elements 330 and, therefore, the desired properties of elements 330. In the illustrated embodiment in FIG. 3, first, second and third elements 330 each have different photonic crystal structures.

To complete the array 300A additional processing steps may be performed. For example, connections between the circuitry 331 and the elements 330 can be formed. Further, additional conventional processing steps can be performed to form conventional micro-lenses 20.

Depending on the photonic crystal structures of the elements 330, the alignment of the elements 330 and the displacement parameters are chosen to enable selection between the desired electromagnetic wavelengths. The elements 330 can be vertically, angularly, or laterally displaced with respect to the substrate 1. For example, the voltages applied are chosen to create the desired electrostatic forces to displace the elements 330 to achieve the desired transmittance and reflectance characteristics of the elements 330. Exemplary voltages for controlling the elements 330 can be between about 5 Volts to about 20 Volts.

FIG. 6 depicts another exemplary embodiment of a pixel array 300B with a MEMS-based photonic crystal element 330 according to the invention. The photonic crystal structure of element 330 can be engineered such that the element 330 has the desired properties, e.g., selectivity for particular wavelengths of electromagnetic radiation. The array 300B can formed as described above in connection with FIGS. 4A-5D, except that one photonic crystal elements 330 is formed over a plurality of pixels. Application of a voltage to the element 330 causes displacement of the element 330. Such displacement causes cause changes in the transmittance and reflectance characteristics of the two structures together. Thus, the elements 330 can be operated to select for particular wavelengths at different times based upon the application of the voltages.

In the illustrated embodiment, the element 330 is configured to be controllable to selectively prevent all light from reaching one or more photo-conversion devices 12. Thus, light incident on one or more specific areas of the array 300B can be sampled. Alternatively, the element is configured to be controllable to select between visible light wavelengths and infrared wavelengths. For this, the variables (thickness d of layer 361, the spacing x between the pillars 362, the ratio x/d, the horizontal cross-sectional shape of the pillars 362, the orientation of the pillars 362, and materials of pillars 362 and layer 363) are selected to achieve the desired photonic crystal structure for each of the first and second elements 330 and, therefore, the desired properties of elements 330. Additionally, depending on the photonic crystal structures of the elements 330, the alignment of the elements 330 and the displacement parameters are chosen to enable selection between the desired electromagnetic wavelengths. For example, the voltages applied are chosen to create the desired electrostatic forces to displace the elements 330 to achieve the desired transmittance and reflectance characteristics of the elements 330.

When the elements 330 are configured to be controllable to select between visible light wavelengths and infrared wavelengths, it is preferable that the photo-conversion devices 12 are sensitive to a wide range of wavelengths. This embodiment enables the array 300B to sample visible light during the day and infrared wavelengths at night. Thus, this embodiment is particularly applicable to automotive and security applications.

Figure 1B:
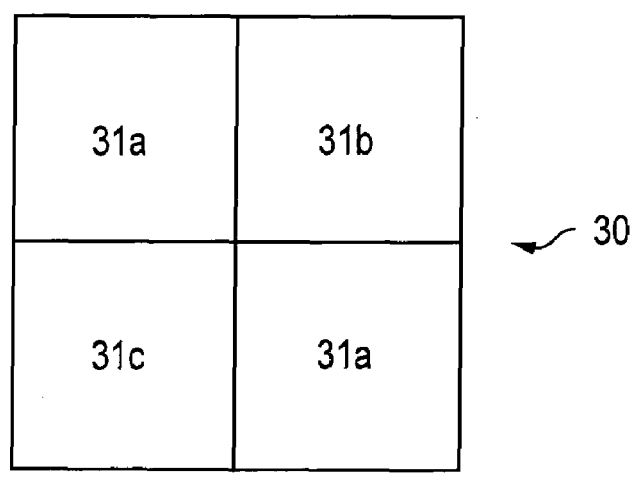
FIG. 1B is a block diagram of a portion of a conventional color filter array.

In another embodiment, FIG. 7 depicts another exemplary embodiment of a pixel array 300C with MEMS-based photonic crystal elements 330 according to the invention. In the FIG. 7 embodiment, depicts a pixel cell array 300C including first, second and third elements 330, each having a photonic crystal structure. The elements 330 are provided at different heights, h1, h2, h3. The elements 330 can be controlled to allow particular wavelengths of light to be incident on the photo-conversion devices 12 at a particular time. The elements 330 can be formed at various heights over the photo-conversion devices 12 as desired and depending on the wavelengths of light to be selected for by each element 330. For example, elements 330 can be controlled to allow red, green and blue wavelengths of light to be incident on the photo-conversion devices 12 at different times. In that manner, signals corresponding to red, green and blue wavelengths can be sampled at different times by a same pixel cell 10. Accordingly, separate pixel cells for sampling red, green and blue wavelengths are not necessary. This may increase the resolution of the imager array 300C. In the embodiment of FIG. 7, elements 330 are configured to serve as a color filter array (and thus replace array of 30 FIG. 1).

Where the elements 330 function to allow each pixel cell 10 to sample red, green and blue wavelengths, it is preferable that the photo-conversion devices 12 are effective over a wide range of wavelengths.

Figure 8:
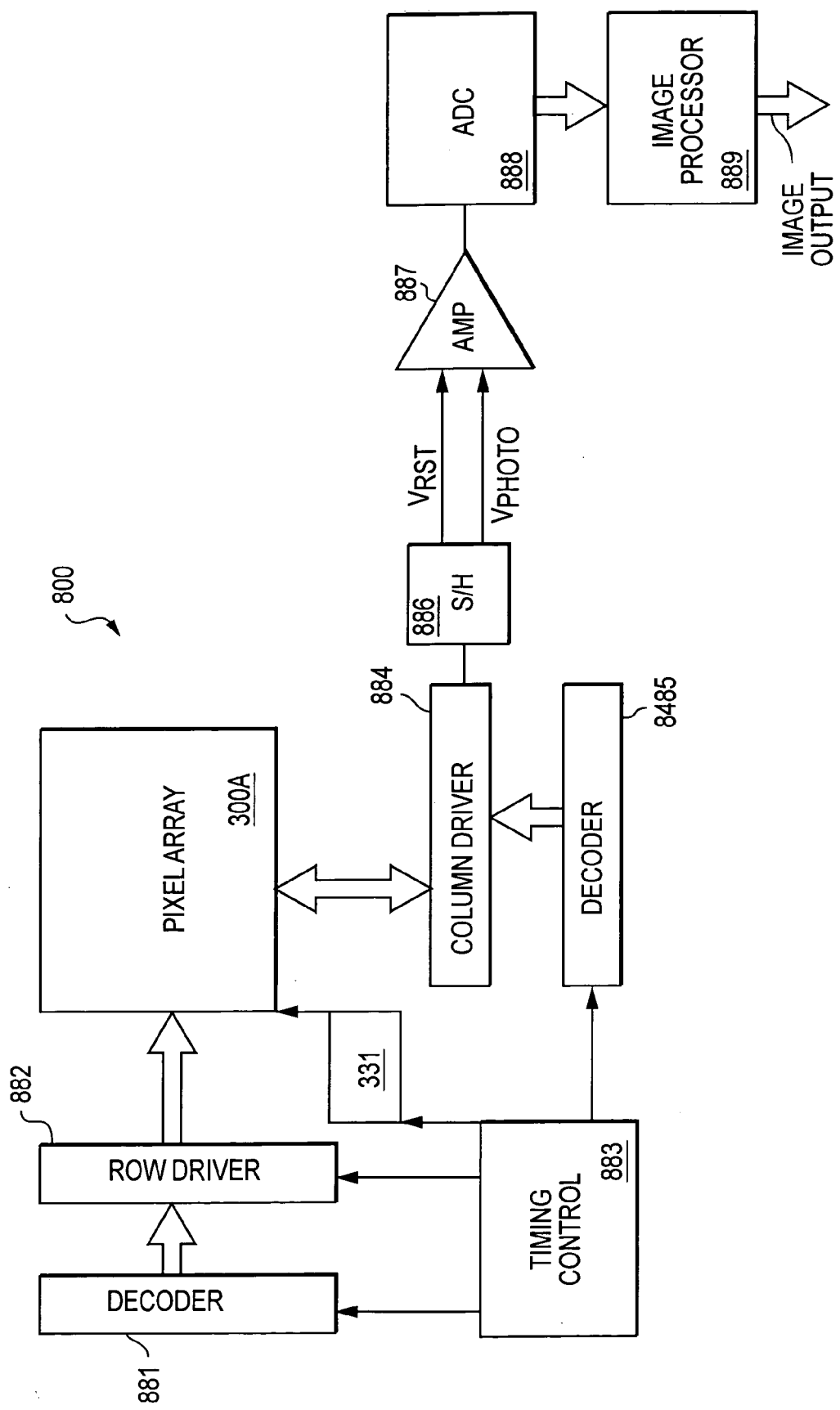
FIG. 8 is a block diagram of an image sensor according to another embodiment of the invention.

A single chip CMOS image sensor 800 is illustrated by the block diagram of FIG. 8. The image sensor 800 includes a pixel cell array 300A according to an embodiment of the invention. The pixel cells of array 300A are arranged in a predetermined number of columns and rows. Alternatively, the image sensor 800 can include other pixel cell arrays according to an embodiment of the invention, such as any of arrays 300B or 300C.

The rows of pixel cells in array 300A are read out one by one. Accordingly, pixel cells in a row of array 300A are all selected for readout at the same time by a row select line, and each pixel cell in a selected row provides a signal representative of received light to a readout line for its column. In the array 300A, each column also has a select line, and the pixel cells of each column are selectively read out in response to the column select lines.

The row lines in the array 300A are selectively activated by a row driver 882 in response to row address decoder 881. The column select lines are selectively activated by a column driver 884 in response to column address decoder 885. The array 300A is operated by the timing and control circuit 883, which controls address decoders 881, 885 for selecting the appropriate row and column lines for pixel signal readout, and circuitry 331 controls the MEMS-based photonic crystal elements 330.

The signals on the column readout lines typically include a pixel reset signal ($V_{rst}$) and a pixel image signal ($V_{photo}$) for each pixel cell. Both signals are read into a sample and hold circuit (S/H) 886 in response to the column driver 884. A differential signal ($V_{rst}-V_{photo}$) is produced by differential amplifier (AMP) 887 for each pixel cell, and each pixel cell's differential signal is amplified and digitized by analog-to-digital converter (ADC) 888. The analog-to-digital converter 888 supplies the digitized pixel signals to an image processor 889, which performs appropriate image processing before providing digital signals defining an image output.

FIG. 9 illustrates a processor-based system 900 including the image sensor 800 of FIG. 8. The processor-based system 900 is exemplary of a system having digital circuits that could include image sensor devices. Without being limiting, such a system could include a computer system, camera system, scanner, machine vision, vehicle navigation, video phone, surveillance system, auto focus system, star tracker system, motion detection system, image stabilization system, and other system employing imaging.

The processor-based system 900, for example a camera system, generally comprises a central processing unit (CPU) 995, such as a microprocessor, that communicates with an input/output (I/O) device 991 over a bus 993. Image sensor 800 also communicates with the CPU 995 over bus 993. The processor-based system 900 also includes random access memory (RAM) 992, and can include removable memory 994, such as flash memory, which also communicate with CPU 995 over the bus 993. Image sensor 800 may be combined with a processor, such as a CPU, digital signal processor, or microprocessor, with or without memory storage on a single integrated circuit or on a different chip than the processor.

Although the invention is described in connection with CMOS image sensor, MEMS-based photonic crystal elements 330 have various applications within optoelectronic devices. This specification is not intended to be limiting. For example, MEMS-based photonic crystal elements 330 according to the invention can be employed in a Charge Coupled Device image sensor or other optoelectronic devices.

It is again noted that the above description and drawings are exemplary and illustrate preferred embodiments that achieve the objects, features and advantages of the present invention. It is not intended that the present invention be limited to the illustrated embodiments. Any modification of the present invention which comes within the spirit and scope of the following claims should be considered part of the present invention.

What is claimed as new and desired to be protected by Letters Patent of the United States is:

1. An image sensor comprising: an array of pixel cells at a surface of a substrate, each pixel cell comprising a photo-conversion device; and at least two micro-electro-mechanical system (MEMS) elements stacked over at least one of the pixel cells and displaced over one another at different heights from the surface of the substrate, the MEMS elements comprising:
    a photonic crystal structure comprising:
    an insulating layer supported by a support structure; a plurality of pillars on the insulating layer, the pillars being spaced apart from each other; and a conductive layer in contact with at least a portion of the pillars, wherein the photonic crystal structure is located over at least one of the pixel cells and adapted to selectively permit electromagnetic radiation having a predetermined wavelength to pass through the photonic crystal structure to the photo-conversion device of the at least one cell in response to at least one applied voltage; and
    wherein the support structure is adapted to selectively displace the photonic crystal structure in a direction perpendicular to the surface of the substrate in response to the at least one applied voltage.

2. The image sensor of claim 1, wherein the MEMS elements are configured to be controllable by applied voltages to selectively permit green wavelengths of light, red wavelengths of light, and blue wavelengths of light to reach the photo-conversion device at different times.

3. The image sensor of claim 1, wherein the MEMS elements are configured to be controllable by applied voltages to selectively permit visible wavelengths of light and infrared wavelengths of light to reach the photo-conversion device at different times.

4. The image sensor of claim 1, wherein the photonic crystal structure further comprises a material within the spacing between the pillars, the material having a dielectric constant that is lower than a dielectric constant of the pillars.

5. The image sensor of claim 4, wherein the pillars comprise aluminum oxide.

6. The image sensor of claim 1 wherein the conductive layer is a metal layer.

7. A processor system comprising: a processor; and an optoelectronic device coupled to the processor, the device comprising: an array of pixel cells at a surface of a substrate, each pixel cell comprising a photo-conversion device, and a plurality of micro-electro-mechanical system (MEMS) elements displaced over one another at different heights from the surface of the substrate comprising:
    a photonic crystal structure comprising:
    an insulating layer supported by a support structure; a plurality of pillars on the insulating layer, the pillars being spaced apart from each other; and a metal layer in contact with at least a portion of the pillars, wherein the photonic crystal structure is located over at least one of the pixel cells and adapted to selectively permit electromagnetic radiation having a predetermined wavelength to pass through the photonic crystal structure to the photo-conversion device of the at least one cell in response to at least one applied voltage; and
    wherein the support structure is adapted to selectively displace the photonic crystal structure in a direction perpendicular to the surface of the substrate in response to the at least one applied voltage.

8. The processor system of claim 7, wherein the image sensor is a CMOS image sensor.

9. The processor system of claim 7, wherein the device is a charge coupled device image sensor.

10. The processor system of claim 7, wherein the at least one MEMS element is configured to be controllable by applied voltages to selectively permit predetermined electromagnetic wavelengths to reach the photo-conversion device at different times.

11. A method of forming an image sensor, the method comprising the acts of:
    forming an array of pixel cells at a surface of a substrate, each pixel cell formed comprising a photo-conversion device; and forming at least two micro-electro-mechanical system (MEMS) elements displaced over one another over at least one of the pixel cells comprising:
    a photonic crystal structure located over at least one of the pixel cells adapted to selectively permit electromagnetic radiation having a predetermined wavelength to reach the photo-conversion device of the at least one cell in response to at least one applied voltage,
    wherein the photonic crystal structure comprises an insulating layer supported by a support structure; a plurality of pillars on the insulating layer, the pillars being spaced apart from each other; and a conductive layer in contact with at least a portion of the pillars; and wherein the support structure is adapted to displace the photonic crystal structure in a direction perpendicular to the surface of the substrate in response to the at least one applied voltage.

12. The method of claim 11, wherein the act of forming the plurality of MEMS elements comprises configuring the photonic crystal structures to be controllable by applied voltages to selectively permit green wavelengths of light, red wavelengths of light, and blue wavelengths of light to reach the photo-conversion device at different times.

13. The method of claim 11, wherein the act of forming the plurality of MEMS elements comprises configuring the MEMS elements to be controllable to selectively permit visible wavelengths of light and infrared wavelengths of light to reach the photo-conversion device at different times.

14. The method of claim 11, wherein the photonic crystal structure further comprises material within the spacing between the pillars, the material having a dielectric constant that is lower than a dielectric constant of the pillars.

15. The method of claim 11, wherein the conductive layer is a metal layer.

* * * * *